United States Patent
Saggio et al.

(10) Patent No.: US 12,255,233 B2
(45) Date of Patent: Mar. 18, 2025

(54) SILICON CARBIDE VERTICAL CONDUCTION MOSFET DEVICE FOR POWER APPLICATIONS AND MANUFACTURING PROCESS THEREOF

(71) Applicant: STMicroelectronics S.r.l., Agrate Brianza (IT)

(72) Inventors: Mario Giuseppe Saggio, Aci Bonaccorsi (IT); Alessia Maria Frazzetto, Sant'Agata Li Battiati (IT); Edoardo Zanetti, Valverde (IT); Alfio Guarnera, Trecastagni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 475 days.

(21) Appl. No.: 17/579,474

(22) Filed: Jan. 19, 2022

(65) Prior Publication Data
US 2022/0246723 A1    Aug. 4, 2022

(30) Foreign Application Priority Data

Jan. 29, 2021 (IT) .......................... 102021000001895

(51) Int. Cl.
| | | |
|---|---|---|
| H01L 21/00 | (2006.01) | |
| H01L 21/04 | (2006.01) | |
| H01L 29/08 | (2006.01) | |
| H01L 29/10 | (2006.01) | |
| H01L 29/16 | (2006.01) | |

(Continued)

(52) U.S. Cl.
CPC ........ H01L 29/086 (2013.01); H01L 21/0465 (2013.01); H01L 29/1095 (2013.01); H01L 29/1608 (2013.01); H01L 29/66068 (2013.01); H01L 29/7802 (2013.01)

(58) Field of Classification Search
CPC ............... H01L 29/086; H01L 21/0465; H01L 29/1095; H01L 29/1608; H01L 29/66068; H01L 29/7802
See application file for complete search history.

(56) References Cited

U.S. PATENT DOCUMENTS

2008/0239792 A1* 10/2008 Wann ................ H01L 21/76895
                                                                 257/757
2012/0193643 A1     8/2012 Masuda et al.
(Continued)

FOREIGN PATENT DOCUMENTS

WO     WO 2019198168 A1     10/2019

*Primary Examiner* — Richard A Booth
(74) *Attorney, Agent, or Firm* — Seed IP Law Group LLP

(57) ABSTRACT

A vertical conduction MOSFET device includes a body of silicon carbide having a first conductivity type and a face. A metallization region extends on the face of the body. A body region of a second conductivity type extends in the body, from the face of the body, along a first direction parallel to the face and along a second direction transverse to the face. A source region of the first conductivity type extends towards the inside of the body region, from the face of the body. The source region has a first portion and a second portion. The first portion has a first doping level and extends in direct electrical contact with the metallization region. The second portion has a second doping level and extends in direct electrical contact with the first portion of the source region. The second doping level is lower than the first doping level.

20 Claims, 5 Drawing Sheets

(51) Int. Cl.
    *H01L 29/66*       (2006.01)
    *H01L 29/78*       (2006.01)

(56) References Cited

U.S. PATENT DOCUMENTS

| | | |
|---|---|---|
| 2016/0163817 A1 | 6/2016 | Horii et al. |
| 2016/0181373 A1 | 6/2016 | Masuda et al. |
| 2017/0077238 A1* | 3/2017 | Kono ................ H01L 29/41766 |
| 2017/0077285 A1 | 3/2017 | Uehara et al. |
| 2018/0308936 A1 | 10/2018 | Shimizu et al. |
| 2020/0259012 A1 | 8/2020 | Pala et al. |
| 2020/0388695 A1 | 12/2020 | Sundaresan et al. |
| 2021/0119008 A1 | 4/2021 | Takahashi et al. |
| 2022/0246729 A1 | 8/2022 | Saggio et al. |

* cited by examiner

SILICON CARBIDE VERTICAL CONDUCTION MOSFET DEVICE FOR POWER APPLICATIONS AND MANUFACTURING PROCESS THEREOF

BACKGROUND

Technical Field

The present disclosure relates to a silicon carbide vertical conduction MOSFET device for power applications and to the manufacturing process thereof.

Description of the Related Art

As is known, semiconductor materials having a wide bandgap, for example greater than 1.1 eV, low ON-state resistance, high thermal conductivity, high operating frequency and high saturation velocity of the charge carriers enable electronic devices to be obtained, for example diodes and transistors, having a better performance than silicon electronic devices, in particular for power applications, for example operating at voltages comprised between 600 V and 1300 V or in specific operating conditions, such as high temperature.

In particular, it is known to obtain such electronic devices starting from a silicon carbide wafer in one of its polytypes, for example 3C—SiC, 4H—SiC and 6H—SiC, which are distinguished by the characteristics listed above.

BRIEF SUMMARY

The present disclosure provides various embodiments which at least partially overcome the drawbacks of the prior art.

According to the present disclosure, a MOSFET device and a manufacturing process thereof are provided.

In at least one embodiment, a vertical conduction MOSFET device is provided that includes a silicon carbide body having a first conductivity type and a face. A metallization region extends on the face of the body. A body region having a second conductivity type different than the first conductivity type, extends in the body, from the face of the body, along a first direction parallel to the face and along a second direction transverse to the face. A source region having the first conductivity type extends towards an inside of the body region, from the face of the body. The source region includes a first portion and a second portion. The first portion has a first doping level and extends in direct electrical contact with the metallization region. The second portion has a second doping level and extends in direct electrical contact with the first portion of the source region. The second doping level is lower than the first doping level.

In at least one embodiment, a process for manufacturing a vertical conduction MOSFET device is provided that includes: forming, in a silicon carbide work body having a first conductivity type, a body region of a second conductivity type, the body region extending from a face of the work body along a first direction parallel to the face and along a second direction transverse to the face; forming a source region having the first conductivity type in the body region, the source region extending from the face of the work body, the forming the source region including forming a first portion of the source region and forming a second portion of the source region, the first portion having a first doping level and extending in direct electrical contact with the metallization region, the second portion having a second doping level and extending in direct electrical contact with the first portion of the source region, the second doping level being lower than the first doping level; and forming a metallization region on the face of the work body.

In at least one embodiment, a device is provided that includes a silicon carbide body having a first conductivity type. A metallization region extends on a surface of the body. A body region having a second conductivity type different than the first conductivity type extends into the body from the surface of the body. A source region having the first conductivity type extends into the body region from the surface of the body. The source region includes: a first portion having a first doping level and in direct contact with the metallization region at the surface, and a second portion having a second doping level different than the first doping level, the second portion directly contacting and laterally surrounding the first portion.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
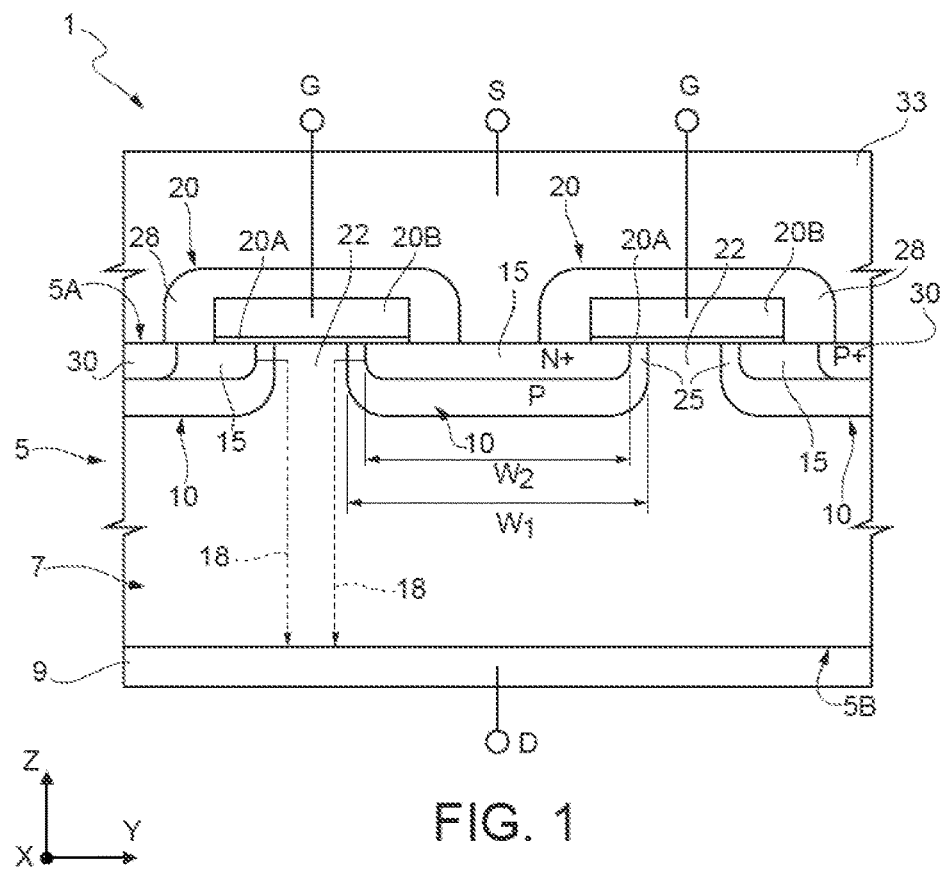
FIG. 1 shows a cross-section of a silicon carbide vertical conduction MOSFET device in accordance with a comparative example.

FIG. 1 shows a comparative example of a vertical conduction MOSFET device 1, in a Cartesian reference system XYZ comprising a first axis X, a second axis Y, and a third axis Z.

The MOSFET device 1 is formed by a plurality of elementary cells, only some of which are illustrated here, which are the same as one another, are arranged in parallel in a same die, and share a source terminal S and a drain terminal D.

The MOSFET device 1 is formed in a body 5 of silicon carbide having a first surface 5A and a second surface 5B.

The body 5 houses a drain region 7, a plurality of body regions 10 and a plurality of source regions 15.

The drain region 7, here of an N type, extends between the first surface 5A and the second surface 5B of the body 5.

A drain contact region 9 of conductive material, for example of metal or silicide, extends on the second surface 5B of the body 5, in direct electrical contact with the drain region 7, and forms the drain terminal D of the MOSFET device 1.

The body regions 10 are of a P type and extend in the body 5 from the first surface 5A. Each body region 10 has a doping level comprised between $1 \cdot 10^{17}$ atoms/cm$^3$ and $1 \cdot 10^{20}$ atoms/cm$^3$, a depth comprised between 0.3 μm and 2 μm, along the third axis Z, and a width $W_1$ along the second axis Y.

Two adjacent body regions 10 delimit, along the second axis Y, a surface portion 22 of the drain region 7.

The body regions 10 moreover extend along the first axis X, being for example strip- or ring-shaped in top view, here not illustrated.

The source regions 15 each extend from the first surface 5A of the body 5 into a respective body region 10 and are of an N type, with doping level comprised between $1 \cdot 10^{18}$ atoms/cm$^3$ and $1 \cdot 10^{20}$ atoms/cm$^3$. Each source region 15 has a width $W_2$, along the second axis Y, smaller than the width $W_1$ of the respective body region 10, and a depth, along the third axis Z, smaller than the depth of the respective body region 10.

Each source region 15 and each surface portion 22 of the drain region 7 laterally delimit a channel region 25 in a respective body region 10.

The MOSFET device 1 further comprises a plurality of insulated gate regions 20. The insulated gate regions 20 are each formed by a gate insulating layer 20A, in contact with the first surface 5A of the body 5; a gate conductive layer 20B, directly overlying the gate insulating layer 20A; and a passivation layer 28, which covers the gate conductive layer 20B and, together with the gate insulating layer 20A, seals the gate conductive layer 20B. In detail, the gate insulating layer 20A of an insulated gate region 20 extends on a respective surface portion 22 of the drain region 7, on two channel regions 25 adjacent to the respective surface portion 22, and partially on two source regions 15 adjacent to the respective channel regions 25.

The gate conductive layers 20B of the insulated gate regions 20 are electrically connected in parallel, in a way here not illustrated, to form a gate terminal G of the MOSFET device 1.

The MOSFET device 1 further comprises a plurality of body contact regions 30 and a front metallization region 33.

The body contact regions 30 are of a P+ type and each extend, from the first surface 5A of the body 5, into a respective source region 15, in contact with a respective body region 10. Generally, in MOSFET devices, each source region 15 accommodates more than one body contact region 30, which are mutually arranged at a distance along the first axis X of FIG. 1. Furthermore, as may be seen in FIG. 1, the body contact regions 30 of adjacent source regions 15 are arranged staggered so that, along the second axis Y, no body contact region 30 is visible in the portion of the central source region 15.

The front metallization region 33, for example of metal material and/or metal silicide, forms the source terminal S of the MOSFET device 1 and extends on the first surface 5A of the body 5, in direct electrical contact with the source regions 15 and the body contact regions 30.

Each elementary cell of the MOSFET device 1 has a respective switch-on threshold voltage $V_{th}$. In use, if the voltage $V_{GS}$ between the gate terminal G and the source terminal S is greater than the threshold voltage $V_{th}$, the MOSFET device 1 is in an ON state, where the respective channel region 25 is conductive and an operating current can flow between the source terminal S and the drain terminal D, along the conductive path 18 identified for clarity by a dashed arrow in FIG. 1.

In specific applications, for example in the case of devices for control of motors, in particular in high-power applications, where the operating voltage of the MOSFET device 1 can assume a high value, for example comprised between 400 V and 850 V or even higher, it is desirable that the MOSFET device 1 has a high short-circuit withstand time (SCWT). In fact, in the case of an undesired short-circuit, the voltage $V_{DS}$ between the source terminal S and the drain terminal D of the MOSFET device 1 can assume a high value, for example comprised between 400 V and 850 V, or even higher, while the MOSFET device 1 is in ON state. In this condition, the MOSFET device 1 is traversed by a maximum current, corresponding to the saturation current $I_{SAT}$ of the MOSFET device 1 itself, which is greater than the operating current established in the design stage. The product of the voltage $V_{DS}$ and the saturation current $I_{SAT}$ can cause a high heat dissipation within the MOSFET device 1. The high heat dissipation, especially if protracted over time, can lead to a rise in temperature such as to cause, locally, melting of a portion of the MOSFET device 1, in particular of the body 5, with consequent risk of damage to the MOSFET device 1 and/or failure thereof.

It is therefore desirable to seek to reduce the saturation current $I_{SAT}$ of the MOSFET device 1, in order to increase the short-circuit withstand time thereof. For instance, it is desirable to increase the resistance of the conductive path 18 by reduction of the doping level of the source regions 15, and/or by reduction of the contact area between the source regions 15 and the front metallization region 33, and/or by formation of elementary cells without source regions 15.

However, the above solutions have disadvantages. In fact, for example, these solutions drastically increase the ON-state resistance of the conductive path 18, also in conditions of normal use, i.e., in the absence of undesired short-circuits, thus limiting the value of the operating current.

This consequently leads to a degradation in the performance of the MOSFET device 1.

Figure 2:
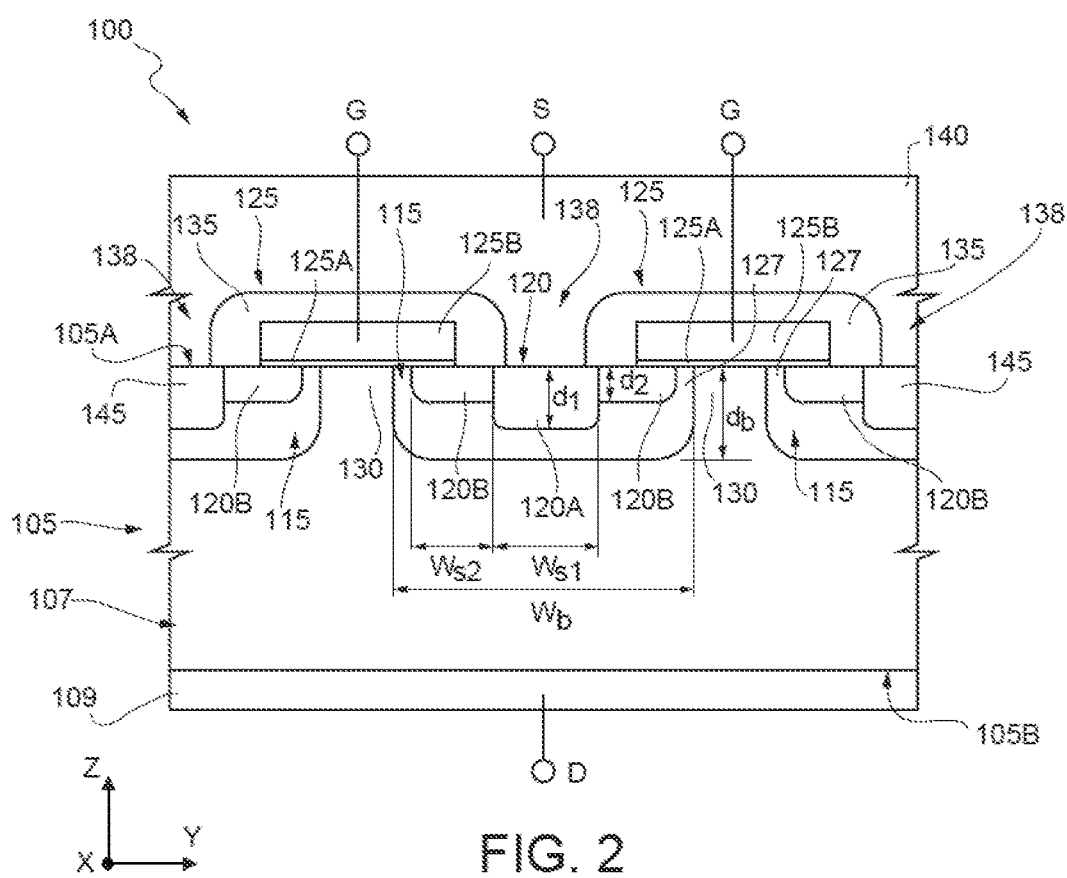
FIG. 2 shows a cross-section of the present silicon carbide vertical conduction MOSFET device, according to one or more embodiments.
Figure 3:
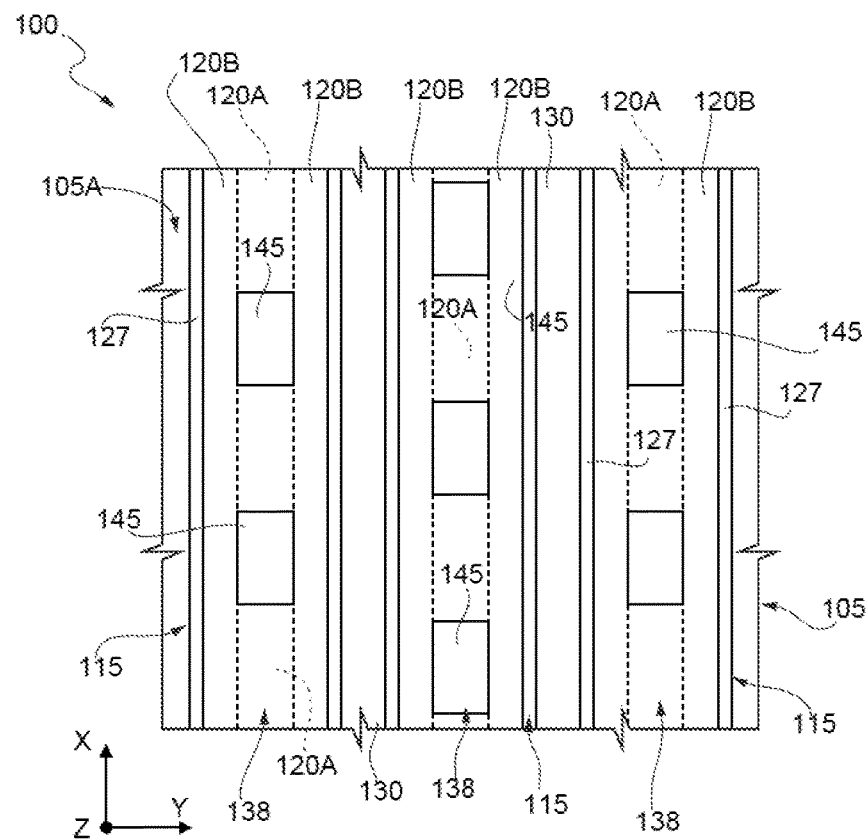
FIG. 3 shows a top plan view of the MOSFET device of FIG. 2.

FIGS. 2 and 3 show a vertical conduction MOSFET device 100 in a Cartesian reference system XYZ having a first axis X, a second axis Y and a third axis Z, in accordance with one or more embodiments of the present disclosure.

The MOSFET device 100 is formed by a plurality of elementary cells, only some of which are illustrated in FIGS. 2 and 3, which are the same as one another and are arranged in a same die so as to share a drain terminal D, a gate terminal G and a source terminal S; i.e., the elementary cells are electrically connected in parallel to one another.

The MOSFET device 100 is formed in a body 105 of semiconductor material having a first surface 105A and a second surface 105B.

The body 105 may be formed by a substrate or by a substrate on which one or more epitaxial layers are grown and is of silicon carbide, in one of its polytypes, here the 4H—SiC polytype.

The body 105 accommodates a drain region 107, a plurality of body regions 115, and a plurality of source regions 120.

In this embodiment, the body 105 also accommodates a plurality of body contact regions 145, here of a P type, which each extend from the first surface 105A of the body 105, within a respective body region 115, in direct electrical contact therewith. The body contact regions 145 each have a doping level, for example comprised between $1 \cdot 10^{19}$ atoms/cm$^3$ and $1 \cdot 10^{20}$ atoms/cm$^3$.

The drain region 107, here of an N type, extends between the first and the second surfaces 105A, 105B of the body 105.

A drain contact region 109, of conductive material, for example metal or silicide, extends on the second surface 105B of the body 105, in direct electrical contact, in particular in ohmic contact, with the drain region 107. The drain contact region 109 forms the drain terminal D of the MOSFET device 100.

The body regions 115 are here of a P type and extend in the body 105 starting from the first surface 105A of the body 105, and each have a body depth $d_b$, which is comprised, for example, between 0.3 µm and 1.5 µm, in particular 0.3 µm, along the third axis Z.

In addition, the body regions 115 each have a width $W_b$ along the second axis Y.

Two adjacent body regions 115 are separated, along the second axis Y, by a surface portion 130 of the drain region 107.

The source regions 120 are here of an N type and each extend from the first surface 105A of the body 105 into a respective body region 115.

The source regions 120 comprise heavy portions 120A and light portions 120B. In FIGS. 2 and 3, the heavy portions 120A and the light portions 120B are separated from one another, for clarity, by a dashed line.

The heavy portions 120A of the source regions 120 each extend from the first surface 105A of the body 105 into a respective body region 115. The heavy portions 120A of the source regions 120 each have a width $W_{s1}$ along the second axis Y, which is smaller than the width $W_b$ of the body regions 115, and a depth $d_1$, along the third axis Z, which is smaller than the body depth $d_b$.

For instance, the depth $d_1$ of the heavy portions 120A of the source regions 120 is comprised between 0.2 µm and 0.8 µm.

As visible in FIG. 3, the heavy portions 120A of the source regions 120 extend, along the first axis X, between two adjacent body contact regions 145.

Moreover, the heavy portions 120A of the source regions 120 are arranged staggered with respect to adjacent heavy portions 120A along the second axis Y so that, along the second axis Y, the body contact region 145 of a body region 115 is aligned to a respective heavy portion 120A of the adjacent source region 120.

The heavy portions 120A of the source regions 120 have a contact doping level, which is for example comprised between $1\cdot10^{18}$ atoms/cm$^3$ and $1\cdot10^{20}$ atoms/cm$^3$.

The light portions 120B of the source regions 120 each extend from the first surface 105A of the body 105 into a respective body region 115. The light portions 120B of the source regions 120 extend on the two sides, along the second axis Y, of each heavy portion 120A of the respective source region 120 and of each body contact region 145.

In particular, the light portions 120B of the source regions 120 are arranged in a position contiguous with the heavy portions 120A of the respective source region 120 and of the body contact regions 145, in direct electrical connection therewith.

In the top view of FIG. 3, the light portions 120B of the source regions 120 extend along the first axis X, throughout the length of the respective body regions 115.

The light portions 120B of the source regions 120 each have a width $W_{s2}$ along the second axis Y such that each of them delimits on one side, along the second axis Y, a channel portion 127 of a respective body region 115.

In this embodiment, the light portions 120B of the source regions 120 each have a depth $d_2$, along the third axis Z, which is smaller than the body depth $d_b$ and the depth $d_1$ of the heavy portions 120A of the source regions 120.

For instance, the depth $d_2$ of the light portions 120B of the source regions 120 is comprised between 0.1 µm and 0.5 µm.

The light portions 120B have a channel doping level, which is lower than the contact doping level of the heavy portions 120A. For instance, the channel doping level is comprised between $5\cdot10^{17}$ atoms/cm$^3$ and $1\cdot10^{19}$ atoms/cm$^3$.

In the embodiment illustrated in FIG. 3 in the top view on the body 105, the body regions 115 and the source regions 120 extend strip-shaped along the first axis X.

However, the body regions 115 and the source regions 120 may have, in top view, a different shape; for example they may be ring-shaped or may form rectangles or other polygons separate from one another in the body 105.

The MOSFET device 100 further comprises a plurality of insulated gate regions 125, illustrated transparency, for clarity, in FIG. 3.

Once again with reference to FIG. 2, the insulated gate regions 125 extend on the first surface 105A of the body 105 and are each formed by a gate insulating layer 125A, for example of silicon oxide, in contact with the first surface 105A of the body 105; a gate conductive layer 125B, for example of polysilicon, directly overlying the respective gate insulating layer 125A; and a passivation layer 135, which covers at the top and laterally the respective gate insulating layer 125A and the respective gate conductive layer 125B.

The gate conductive layers 125B of the insulated gate regions 125 are electrically connected in parallel, in a way here not illustrated, to form the gate terminal G of the MOSFET device 100.

The insulated gate regions 125 each extend on a respective surface portion 130 of the drain region 107, on two channel portions 127 of two adjacent body regions 115, and on the light portions 120B of two adjacent source regions 120.

In this embodiment, the insulated gate regions 125 extend, along the first axis X, each strip-shaped and, along the second axis Y, at a mutual distance, so as to form elongated openings 138, which are also oriented parallel to the first axis X.

The elongated openings 138 extend on the body contact regions 145 and on the heavy portions 120A of the source regions 120.

The MOSFET device 100 further comprises a front metallization region 140.

The front metallization region 140, for example of metal material (possibly comprising a bottom layer of metallic silicide), extends in the elongated openings 138 and on the passivation layers 135 of the insulated gate regions 125. The front metallization region 140 is in direct electrical contact, in particular in ohmic contact, with the heavy portions 120A of the source regions 120 and with the body contact regions 145. The front metallization region 140 thereby forms the source terminal S of the MOSFET device 100.

The body contact regions 145 cause the front metallization region 140 to short-circuit the source regions 120 and the body regions 115.

In use, in ON state, the conductive path of the MOSFET device 100 between the source terminal S and the drain terminal D of each elementary cell comprises, in series, the heavy portion 120A and the light portion 120B of a respective source region 120, a respective channel portion 127, and the drain region 107.

Since the light portions 120B of the source regions 120 have a lower doping level than the heavy portions 120A, the light portions 120B have a higher electrical resistance than the heavy portions 120A.

At the same time, the doping level of the heavy portions 120A of the source regions 120 is high; i.e., such as to guarantee a low-resistance electrical contact, in particular an ohmic contact, with the front metallization region 140.

Consequently, the conductive path between the source terminal S and the drain terminal D has, as a whole, an electrical resistance such as to reduce the saturation current $I_{SAT}$ of the MOSFET device 100. It follows that the MOSFET device 100 is able to withstand for a long time a condition of undesired short-circuit, if used in power applications, wherein the operating voltage of the MOSFET device 100 can reach values for example comprised between 400 V and 850 V, or even higher; i.e., it has a high short-circuit withstand time (SCWT).

At the same time, the fact that the heavy portions 120A of the source regions 120 form a low-resistance contact with the front metallization region 140 allows the conductive path between the source terminal S and the drain terminal D to maintain a low ON-state electrical resistance in normal operating conditions, that is in absence of undesired short-circuits.

Furthermore, the light portions 120B of the source regions 120 are formed at a lower depth, in the body 105, than the heavy portions 120A. Consequently, as discussed hereinafter with reference to FIGS. 4A-4C, the light portions 120B may be formed through a step of implantation of dopant ions having a low implantation energy, for example comprised between 10 keV and 200 keV. This low implantation energy ensures that the dopant ions that form the light portions 120B of the source regions 120 undergo a lower lateral straggling in the body 105, thus obtaining a concentration profile of the dopant ions that is controllable and in accordance with what has been established at the design stage. Thus, it follows that the doping level of the channel portions 127, which are arranged laterally, in a contiguous position, along the second axis Y, with respect to the light portions 120B of the source regions 120, is scarcely affected by the step of formation of the light portions 120B of the source regions 120.

This enables to obtain a low process variability of the on-state threshold voltage $V_{th}$ of the MOSFET device 100, which therefore has a high reliability.

In addition, a low implantation energy implies a low probability of defects formation in the portions of silicon carbide crystal lattice of the body 105 where the channel portions 127 are formed.

Consequently, the charge carriers in the channel portions 127 have a high mobility, thus guaranteeing good performance of the MOSFET device 100.

Described hereinafter are manufacturing steps of the MOSFET device 100, in particular the manufacturing steps that lead to formation of the source regions 120.

Figure 4A:
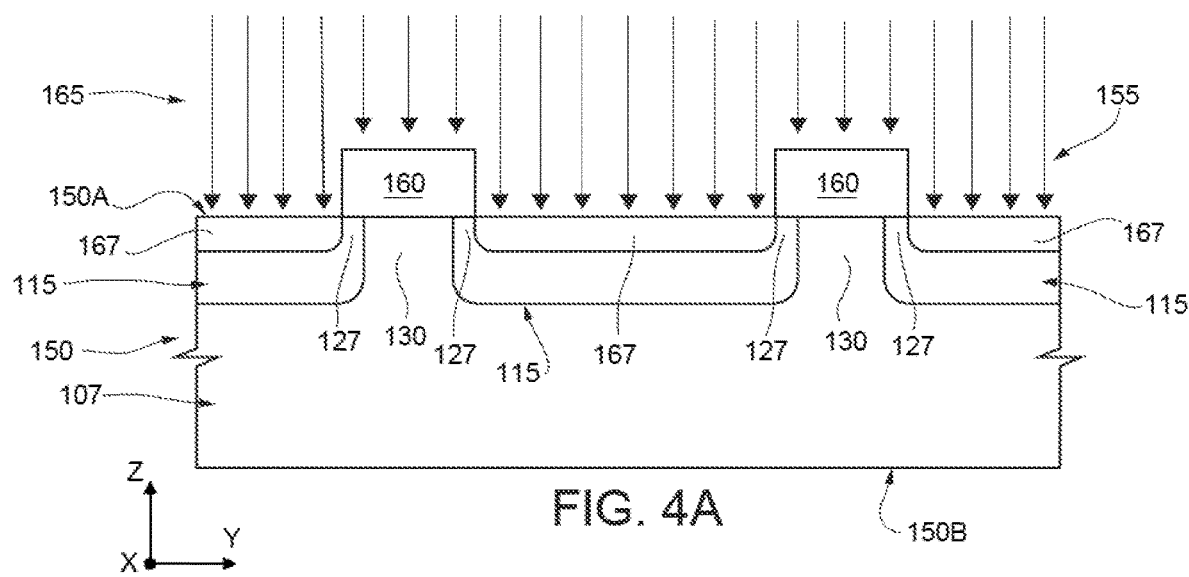
FIGS. 4A-4C show cross-sections of the MOSFET device of FIGS. 2 and 3, in successive manufacturing steps, in accordance with some embodiments.

FIG. 4A shows a wafer 150 of silicon carbide, here having a doping of an N type and a first surface 150A and a second surface 150B. The body regions 115, which laterally delimit the surface portions 130 of the drain region 107, have already been formed in the wafer 150.

A first source mask 155 is formed on the first surface 150A of the wafer 150, for example using known lithographic steps. The first source mask 155 comprises a plurality of portions 160, each having a thickness greater than 0.3 μm, for example comprised between 0.3 μm and 1 μm, mutually spaced apart so as to expose portions of the wafer 150 where the heavy portions 120A and the light portions 120B of the source regions 120 and the body contact regions 145 are intended to be formed.

In particular, the portions 160 of the first source mask 155 can be designed so as to have a small thickness, for example smaller than that of the portions of the mask used for forming the heavy portions 120A of the source regions 120. By doing so, it is possible to control the process parameters thereof in a precise way.

Using the first source mask 155, a first implantation of dopant ions of an N type (here indicated by first arrows 165), for example nitrogen or phosphorus ions, having an implantation energy lower than 200 keV, for example comprised between 10 keV and 200 keV, is performed.

The first implantation forms doped regions 167 within the body regions 115, starting from which the heavy portions 120A and the light portions 120B of the source regions 120 are subsequently formed. In this way, the channel portions 127 of the body regions 115 are moreover delimited.

Next (FIG. 4B), a second source mask 170 is formed on the surface 150A of the work wafer 150, for example using known lithographic steps.

For instance, the second source mask 170 may be formed from the first source mask 155, so as to enable a good alignment thereof with the doped regions 167 and the channel portions 127.

The second source mask 170 comprises a plurality of portions 175, each having a thickness, along the third axis Z, greater than 0.5 μm, for example comprised between 0.5 μm and 1.5 μm, mutually spaced apart so as to expose portions of the work wafer 150 where the heavy portions 120A of the source regions 120 are intended to be formed.

Using the second source mask 170, a second implantation of dopant ions of an N type (here indicated by second arrows 180), for example nitrogen or phosphorus ions, having an implantation energy comprised between 20 keV and 300 keV, is performed.

The second implantation is such to increase the doping of the portions of the doped regions 167 that are left exposed by the portions 175 of the second source mask 170, and such to reverse the type of doping of a part of the portions of the body regions 115 that are left exposed by the portions 175 of the second source mask 170, thus forming the heavy portions 120A of the source regions 120.

Next (FIG. 4C), the second source mask 170 is removed and a body contact mask 183 is formed on the surface 150A of the work wafer 150, for example using known lithographic steps.

Figure 4B:
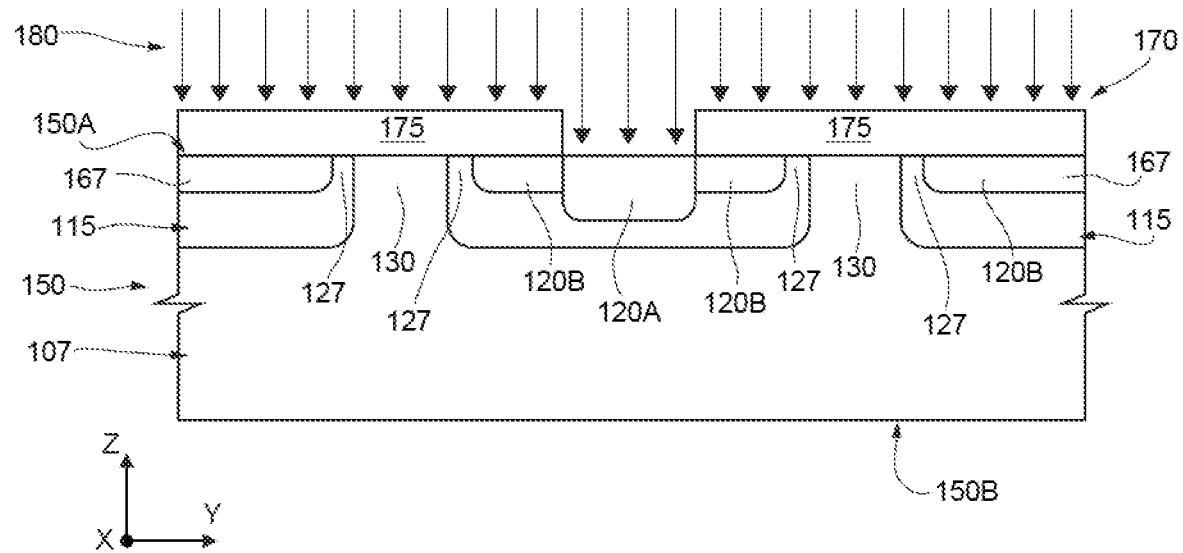
Figure 4C:
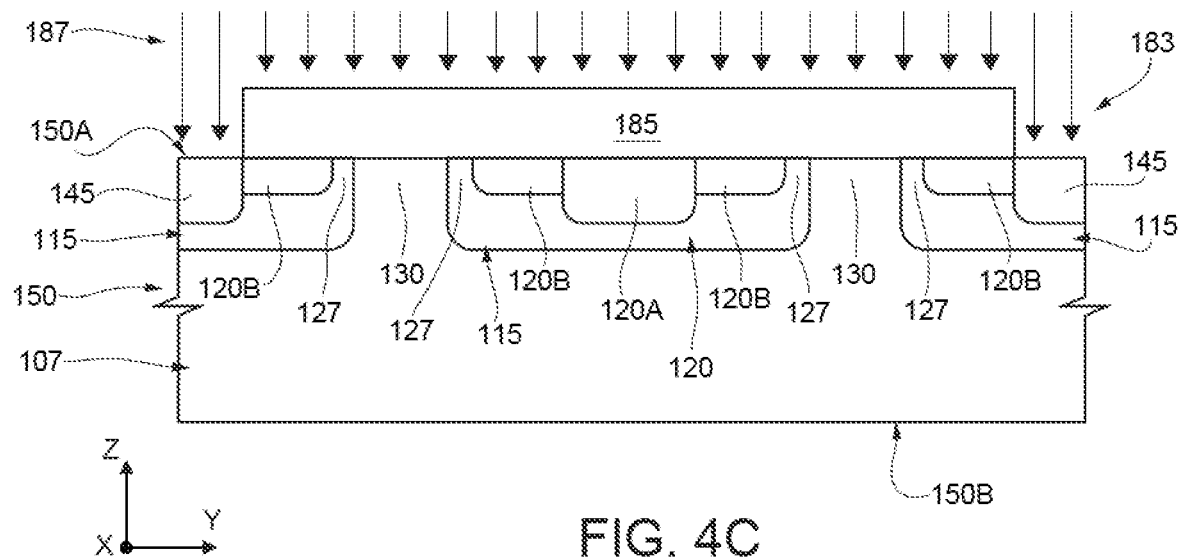

The body contact mask 183 comprises a plurality of portions 185, one of which is visible in FIG. 4C, each having a thickness similar to that of the portions 175 of the second source mask 170. The portions 185 of the body contact mask 183 are mutually spaced apart so as to expose portions of the work wafer 150 where the body contact regions 145 are intended to be formed.

Using the body contact mask 183, an implantation of dopant ions of a P type (here indicated by third arrows 187), for example boron or aluminium ions, having an implantation energy similar to that of the second implantation of dopant ions of an N type of FIG. 4B, for example lower than 300 keV, in particular comprised between 20 keV and 300 keV, is performed.

The third implantation is such to reverse the conductivity type of the portions of the doped regions 167 that are left exposed by the body contact mask 183, thus forming the body contact regions 145. In this way, the light portions 120B of the source regions 120 are also delimited.

Next, the body contact mask 183 is removed and, in a known way here not illustrated, the insulated gate regions 125 are formed on the surface 150A of the wafer 150, the front metallization region 140, and the drain contact region 109.

Moreover, other known manufacturing steps of the wafer 150 follow, for example dicing and electrical connection, thereby forming the MOSFET device 100.

It therefore emerges, as already discussed hereinabove, that the light portions 120B of the source regions 120 are formed using a low implantation energy. This enables to reduce the lateral straggling of the dopant ions, without therefore affecting the doping level of the channel portions 127.

Consequently, the described process enables a lower process variability to be achieved as regards to the width along the second axis Y of the channel portions 127.

Figure 5:
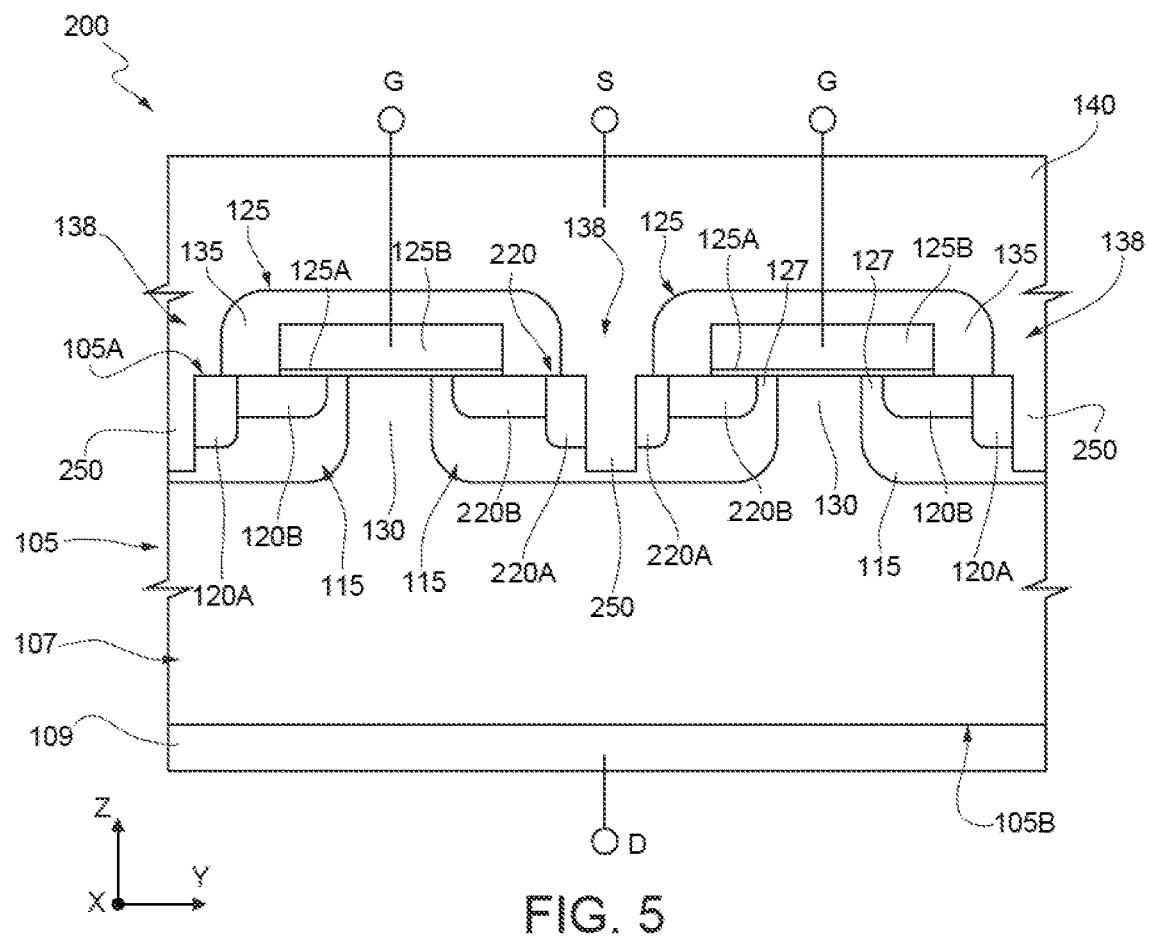
FIG. 5 shows a cross-section of the present silicon carbide vertical conduction MOSFET device, according to one or more embodiments.
Figure 6:
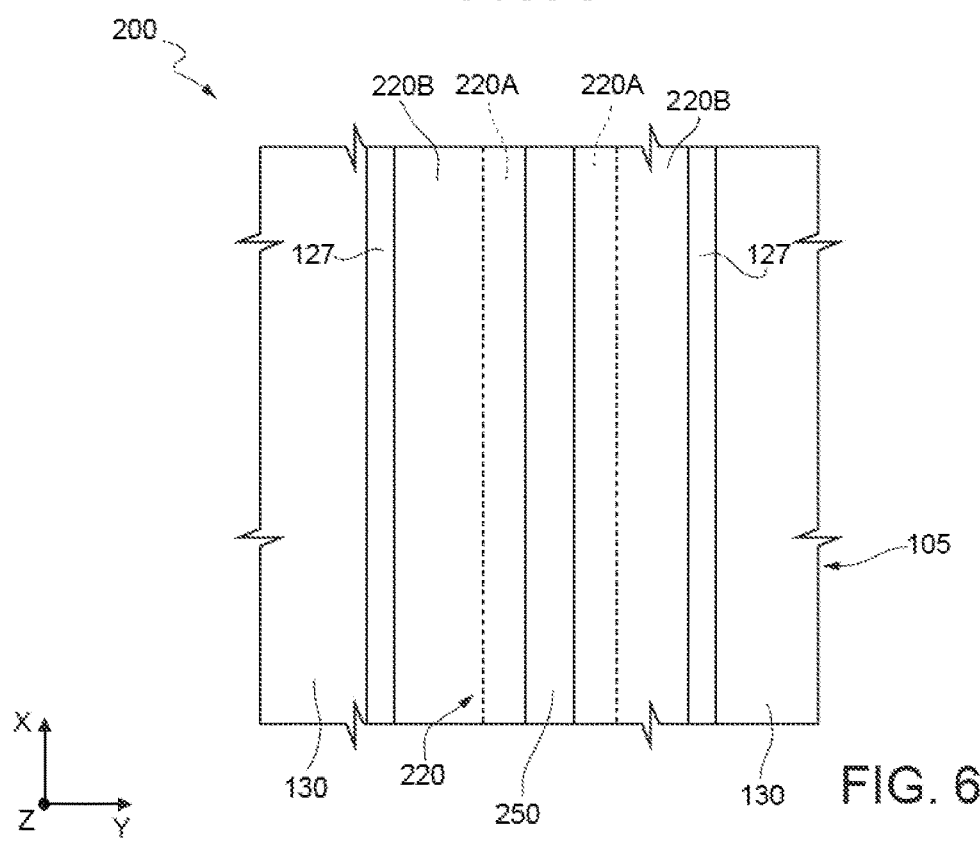
FIG. 6 shows a top plan view of the MOSFET device of FIG. 5.

FIGS. 5 and 6 show a different embodiment of the present MOSFET device, here designated by 200. The MOSFET device 200 has a general structure similar to that of the MOSFET device 100 of FIGS. 2 and 3. Consequently, elements in common are designated by the same reference numbers and are not further described.

The MOSFET device 200 is formed in the body 105, which accommodates the drain region 107 and the body regions 115. The MOSFET device 200 also comprises the insulated gate regions 125, which form the elongated openings 138, and the drain contact region 109.

The source regions, here designated by 220, extend from the first surface 105A of the body 105 into a respective body region 115, and each comprise a respective heavy portion 220A and two respective light portions 220B.

In this embodiment, as visible in top view in FIG. 6, wherein only a body region 115 and a source region 220 are represented for clarity, both the heavy portions 220A and the light portions 220B of the source regions 220 extend, along the first axis X, without interruptions, within the respective body region 115.

The light portions 220B of the source regions 220 therefore extend along the first axis X underneath the insulated gate regions 125, on the two sides of the heavy portions 220A of the source regions 220, in direct electrical contact therewith. Also here, then, the light portions 220B of the source regions 220 each delimit, on one side, a respective channel portion 127.

Similarly to what discussed with reference to the source regions 120 of the MOSFET device 100, the heavy portions 220A each have a higher doping level than the doping level of the light portions 220B.

Moreover, also here, the heavy portions 220A each have a greater depth in the body 105, along the third axis Z, than the light portions 220B.

In this embodiment, the front metallization region 140 (FIG. 5) comprises a plurality of conductive contact portions 250. The conductive contact portions 250 extend in the body 105, starting from the first surface 105A of the body 105, at the elongated openings 138. In detail, the conductive contact portions 250 each extend through the heavy portion 220A of a respective source region 220, in direct electrical contact with the heavy portion 220A and with a respective body region 115. In particular, here, the conductive contact portions 250 extend partially also through a respective body region 115.

In this embodiment, then, the body contact regions 145 are not present.

In use, the MOSFET device 200 has, with respect to the MOSFET device 100 of FIGS. 2-3, a lower contact resistance between the front metallization region 140 and the body regions 115. In this way, the undesired voltage drop between the source regions 220 and the body regions 115 is reduced, thus improving the electrical performance of the MOSFET device 200.

Described hereinafter are steps for manufacturing the MOSFET device 200. The process for manufacturing the MOSFET device 200 comprises steps common to the process for manufacturing the MOSFET device 100, described with reference to FIGS. 4A-4C, which are here not described further.

Figure 7A:
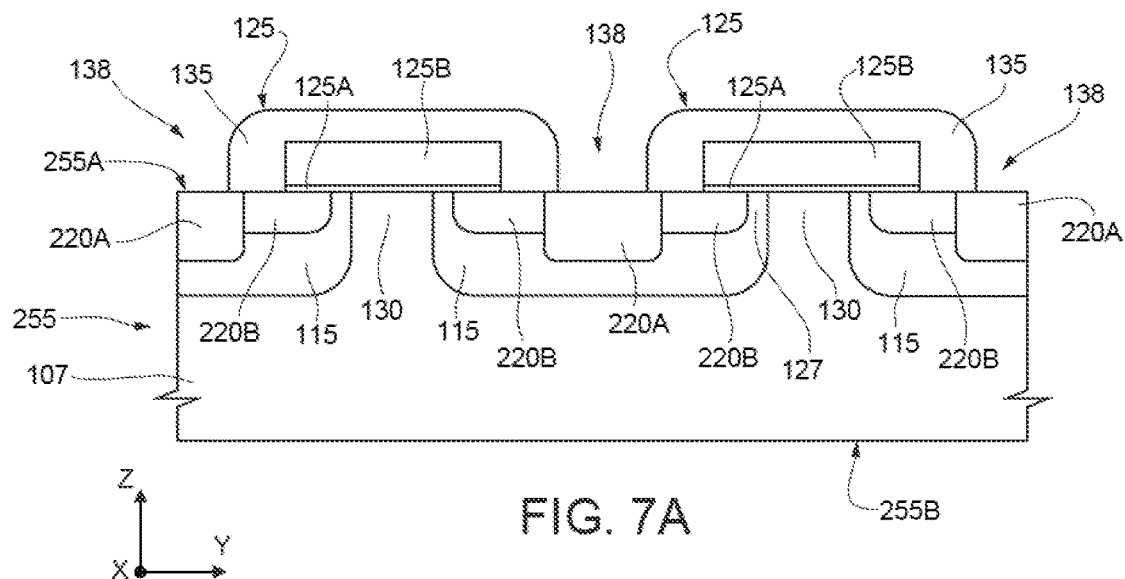
FIGS. 7A-7C show cross-sections of the MOSFET device of FIGS. 5 and 6, in successive manufacturing steps, in accordance with some embodiments.

FIG. 7A shows the silicon carbide wafer of FIG. 4B, here designated by 255, having a doping of an N type and a first surface 255A and a second surface 255B. The body regions 115, which laterally delimit the surface portions 130 of the drain region 107, have already been formed in the wafer 255.

Moreover, the heavy portions 220A and the light portions 220B of the source regions 220 have already been formed in the wafer 255.

The insulated gate regions 125 are formed, in a known way, on the first surface 255A of the wafer 255. Thus, the elongated openings 138 are also delimited.

Next (FIG. 7B), a plurality of trenches 280 is formed in the wafer 255, at the elongated openings 138, where the conductive contact portions 250 of the front metallization region 140 are intended to be formed.

For instance, the trenches 280 may be formed using known processes of lithography and selective chemical etching, for example using the same mask with which the elongated openings 138 are formed or a dedicated mask, which may be formed, for example, in a self-aligned way with respect to the elongated openings 138 or inside the elongated openings 138.

The trenches 280 extend through the heavy portions 220A of the source regions 220 and partially through the body regions 115.

Next (FIG. 7C), a front metallization layer 290 is deposited on the first surface 255A of the wafer 255 so as to fill the trenches 280 and cover the insulated gate regions 125. The front metallization layer 290 may be formed by only one metal layer or by a stack of metal layers.

According to an embodiment, the wafer 255 is subjected to one or more thermal treatments, in a known way.

The front metallization layer 290 therefore forms the front metallization region 140; in particular, also the conductive contact portions 250 thereof are thus formed.

Next, in a way known and here not illustrated, the drain-contact region 109 is formed on the second surface 255B of the wafer 255.

Moreover, other equally known manufacturing steps of the wafer 255 follow, for example dicing and electrical connection, thus forming the MOSFET device 200.

Finally, it is clear that modifications and variations may be made to the MOSFET devices 100, 200 and to the manufacturing processes thereof described and illustrated herein, without thereby departing from the scope of the present disclosure.

For instance, the various embodiments described may be combined so as to provide further solutions.

Furthermore, the conductivity types of the drain region 107, source regions 120, 220, and body regions 115 may be reversed.

For instance, the manufacturing processes described in FIGS. 4A-4C and 7A-7C may comprise a step of annealing of the wafer 150, 255, which is useful for activation of the dopant ions and for reduction of defects in the crystal lattice that may be caused by the implantation.

For instance, the heavy portions and the light portions of the source regions may be formed by a sequence of successive implantations of dopant ions of an N type.

For example, the order of formation of the body regions, of the body contact regions, and of the heavy portions and light portions of the source regions may be modified.

Figure 7B:
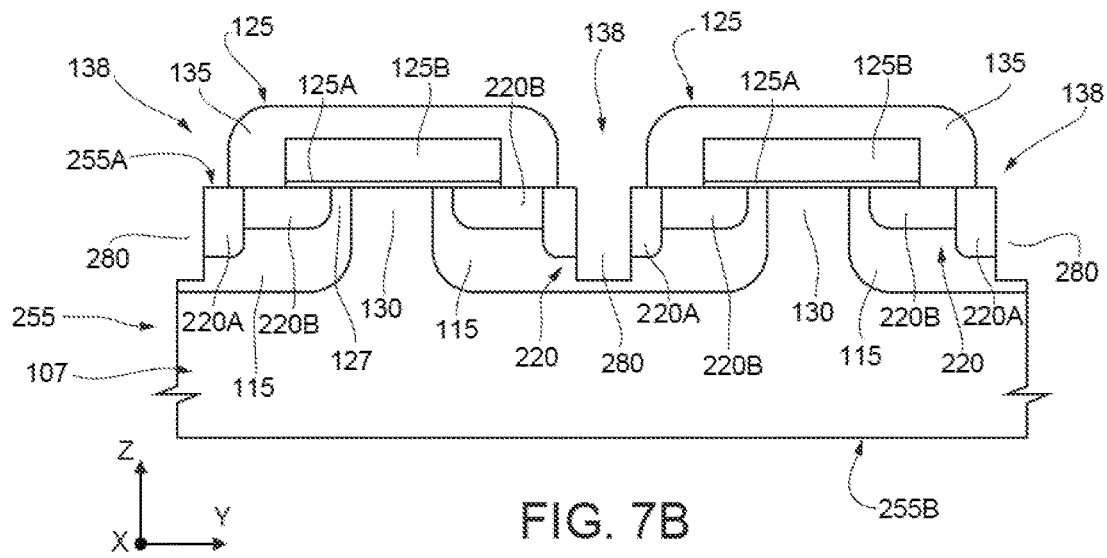
Figure 7C:
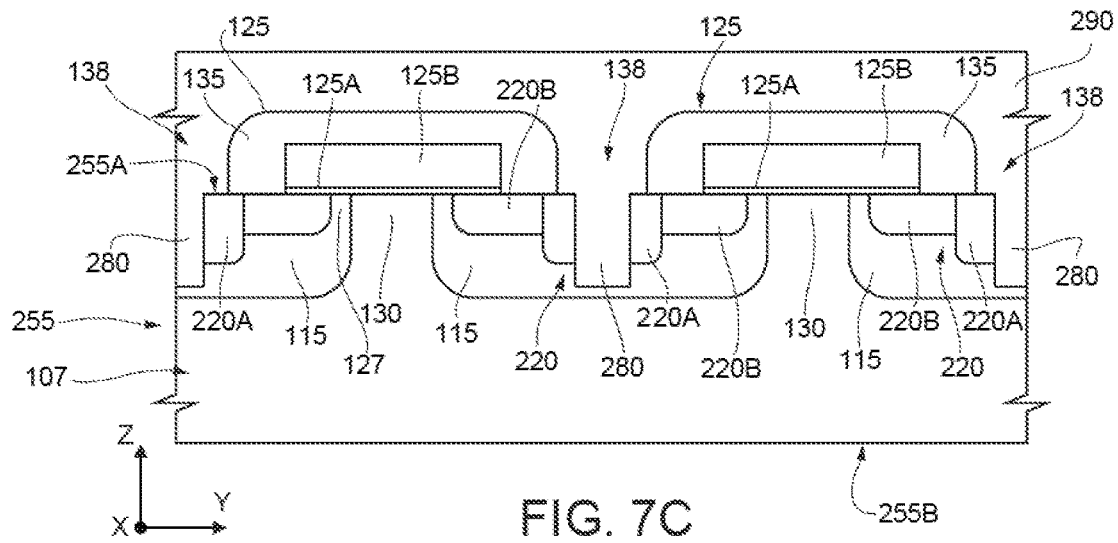

Also the trenches 280 may be formed in a different step from the one illustrated in FIGS. 7A-7C, for example prior to forming the insulated gate regions 125.

A vertical conduction MOSFET device (100; 200) may be summarized as including: a body (105) of silicon carbide having a first conductivity type and a face (105A); a metallization region (140) extending on the face of the body; a body region (115) of a second conductivity type, extending in the body, from the face of the body, along a first direction (Y) parallel to the face and along a second direction (Z) transverse to the face; and a source region (120; 220) of the first conductivity type, extending towards the inside of the body region, from the face of the body, wherein the source region comprises a first portion (120A; 220A) and a second portion (120B; 220B), the first portion having a first doping level and extending in direct electrical contact with the metallization region, the second portion having a second doping level and extending in direct electrical contact with the first portion of the source region, the second doping level being lower than the first doping level.

The body region may include a channel portion (127), the second portion (120B; 220B) of the source region delimiting on one side, along the first direction (Y), the channel portion. The first portion (120A; 220A) of the source region may extend in the body (105), along the second direction (Z), to a first depth ($d_1$) and the second portion (120B; 220B) of the source region may extend in the body, along the second direction, to a second depth ($d_2$), the second depth being smaller than the first depth. The second portion of the source region may extend on one side, along the first direction (Y), in a position contiguous with the first portion of the source region. The first portion (120A; 220A) of the source region may be in ohmic contact with the metallization region (140). The insulated gate region may extend on the face of the body (105A), on the second portion (120B; 220B) of the source region. The insulated gate region may laterally delimit a contact opening (138) on the face of the body, the first portion (120A; 220A) of the source region extending underneath the contact opening. The insulated gate region may be formed by a gate insulating layer (125A), a gate conductive layer (125B) and a passivation layer (135), the gate insulating layer being in contact with the face (105A) of the body, the gate conductive layer directly overlying the gate insulating layer, and the passivation layer covering the gate insulating layer and the gate conductive layer at the top and laterally.

The MOSFET device may further include a body contact region (145) having the second conductivity type, the body contact region being contiguous with the second portion (120B) of the source region (120) along the first direction (Y); extending from the face of the body into the body region (115) along the second direction (Z), in direct electrical contact with the body region; and extending in a position contiguous with the first portion (120A) of the source region along a third direction (X) transverse to the first direction and the second direction.

The metallization region (140) may include a conductive contact portion (250), the conductive contact portion extending in the body, from the face of the body, towards the inside of the body region, in direct electrical contact with the body region and with the source region (220). The conductive contact portion of the metallization region may extend through the source region, in a position contiguous and in direct electrical connection with the first portion (220A) of the source region (220).

A process for manufacturing a vertical conduction MOSFET device, from a work body (150; 255) of silicon carbide having a first conductivity type and a face (150A; 255A), may be summarized as including: forming, in the work body, a body region (115) of a second conductivity type, the body region extending, from the face of the work body, along a first direction (Y) parallel to the face and along a second direction (Z) transverse to the face; forming a source region (120; 220), of the first conductivity type, in the body region, the source region extending from the face of the work body; and forming a metallization region (140) on the face of the work body, wherein forming the source region includes forming a first portion (120A; 220A) of the source region and forming a second portion (120B; 220B) of the source region, the first portion having a first doping level and extending in direct electrical contact with the metallization region, the second portion having a second doping level and extending in direct electrical contact with the first portion of the source region, the second doping level being lower than the first doping level.

Forming a first portion of the source region may include implanting first dopant ions using a first mask, and forming a second portion of the source region may include implanting second dopant ions using a second mask. The first dopant ions may be implanted using a first maximum implantation energy, and wherein the second dopant ions may be implanted using a second maximum implantation energy, the second maximum implantation energy being lower than the first maximum implantation energy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical conduction MOSFET device, comprising:
    a silicon carbide body having a first conductivity type and a face;
    an insulated gate region on the face of the body;
    a continuous metallization layer extending directly on the face of the body, the insulated gate region being between the face and the metallization layer;
    a body region having a second conductivity type different than the first conductivity type, the body region extending in the body, from the face of the body, along a first direction coplanar with the face and along a second direction transverse to the face;
    a source region having the first conductivity type, the source region extending towards an inside of the body region, from the face of the body, the source region including:
        a first portion having a first doping level and being directly coupled to the metallization layer; and
        a second portion having a second doping level and being directly coupled to the first portion of the source region and to the insulated gate region, the second doping level being lower than the first doping level.

2. The MOSFET device according to claim 1, wherein the body region includes a channel portion, the second portion of the source region delimiting on one side, along the first direction, the channel portion.

3. The MOSFET device according to claim 1, wherein the first portion of the source region extends in the body, along the second direction, to a first depth and the second portion of the source region extends in the body, along the second direction, to a second depth, the second depth being less than the first depth.

4. The MOSFET device according to claim 1, wherein the second portion of the source region extends on one side, along the first direction, in a position contiguous with the first portion of the source region.

5. The MOSFET device according to claim 1, wherein the first portion of the source region is in ohmic contact with the metallization layer.

6. The MOSFET device according to claim 1, wherein the insulated gate region extends on the face of the body, on the second portion of the source region.

7. The MOSFET device according to claim 6, wherein the insulated gate region laterally delimits a contact opening on the face of the body, the first portion of the source region extending underneath the contact opening.

8. The MOSFET device according to claim 6, wherein the insulated gate region includes a gate insulating layer, a gate conductive layer and a passivation layer, the gate insulating layer being in contact with the face of the body, the gate conductive layer directly overlying the gate insulating layer, and the passivation layer covering the gate insulating layer and the gate conductive layer.

9. The MOSFET device according to claim 8, wherein the passivation layer is disposed on a top surface of the gate conductive layer and on lateral surfaces of the gate conductive layer and the gate insulating layer.

10. The MOSFET device according to claim 1, further comprising a body contact region having the second conductivity type, the body contact region being contiguous with the second portion of the source region along the first direction, the body contact region extending from the face of the body into the body region along the second direction, in direct electrical contact with the body region, and extending in a position contiguous with the first portion of the source region along a third direction transverse to the first direction and the second direction.

11. A device, comprising:
  a silicon carbide body having a first conductivity type;
  a metallization region extending on a surface of the body;
  an insulated gate region between the metallization region and the surface of the body, the insulated gate region including:
    an insulating layer directly on the body, the insulating layer having a first dimension along a first direction; and
    a conductive layer on the insulating layer having a second dimension along the first direction substantially equal to the first dimension;
  a body region having a second conductivity type different than the first conductivity type, the body region extending into the body from the surface of the body along a second direction transverse to the first direction; and
  a source region having the first conductivity type, the source region extending into the body region from the surface of the body, the source region including:
    a first portion having a first doping level and in direct contact with the metallization region at the surface, and
    a second portion having a second doping level different than the first doping level, the second portion directly contacting and laterally surrounding the first portion.

12. The device according to claim 11, wherein the body region includes a channel portion, the second portion of the source region at least partially delimiting the channel portion.

13. The device according to claim 11, wherein the first portion of the source region extends into the body to a greater depth than the second portion of the source region.

14. The device according to claim 11, wherein the insulated gate region is on the second portion of the source region.

15. The device according to claim 14, wherein the insulated gate region laterally delimits a contact opening on the surface of the body, the metallization region extending into the contact opening and contacting the first portion of the source region.

16. A device, comprising:
  a semiconductor body having a first surface;
  a first insulated gate region on the first surface, the insulated gate region including a passivation layer directly on the first surface;
  a body region with a first conductivity type extending into the semiconductor body from the first surface;
  a source region extending into the body region from the first surface, the source region having a second conductivity type different from the first conductivity type and including:
    a first portion with a first doping level extending a first distance into the body region, the first portion being directly coupled to the passivation layer; and
    a plurality of second portions with a second doping level each extending a second distance into the body region, the second distance being smaller than the first distance, the plurality of second portions being directly coupled to the passivation layer.

17. The device according to claim 16, wherein the first portion has a second surface coplanar with the first surface, a first lateral surface transverse to the second surface and coupled to a first of the plurality of second portions, and a second lateral surface transverse to the second surface and coupled to a second of the plurality of second portions.

18. The device according to claim 16, wherein the first insulated gate region is on the body region, the first portion, and the plurality of second portions.

19. The device according to claim 18, wherein the first insulated gate region includes a gate insulating layer on the first surface and a gate conductive layer on the gate insulating layer.

20. The device according to claim 19, further comprising a second insulated gate region on the first surface coupled in parallel with the first insulated gate region.

* * * * *